(12) United States Patent
Jin et al.

(10) Patent No.: US 12,489,429 B2
(45) Date of Patent: Dec. 2, 2025

(54) INDUCTIVE LOAD DRIVER WITH PWM REGULATION AND FAST SHUT DOWN CURRENT DECAY

(71) Applicant: STMicroelectronics International N.V., Geneva (CH)

(72) Inventors: Gang Jin, Westland, MI (US); Jennifer Carabott, New Hudson, MI (US); Devan Ternan, Madison Heights, MI (US)

(73) Assignee: STMicroelectronics International N.V., Geneva (CH)

( * ) Notice: Subject to any disclaimer, the term of this patent is extended or adjusted under 35 U.S.C. 154(b) by 6 days.

(21) Appl. No.: 18/612,022

(22) Filed: Mar. 21, 2024

(65) Prior Publication Data

US 2025/0300636 A1 Sep. 25, 2025

(51) Int. Cl.
*H03K 17/00* (2006.01)
*H03K 3/017* (2006.01)
*H03K 17/56* (2006.01)

(52) U.S. Cl.
CPC ............ *H03K 3/017* (2013.01); *H03K 17/56* (2013.01)

(58) Field of Classification Search
CPC ........ H03K 17/56; H03K 3/017; H03K 17/64; H03K 17/66; H03K 17/661; H03K 17/687; H03K 17/6871; H03K 17/731; H03K 17/732
See application file for complete search history.

(56) References Cited

U.S. PATENT DOCUMENTS

| 5,457,364 | A | * | 10/1995 | Bilotti | H02H 7/0855 |
| | | | | | 318/434 |
| 11,469,026 | B1 | | 10/2022 | Wetzel et al. | |
| 11,876,509 | B1 | * | 1/2024 | Zeng | H03K 17/166 |
| 2011/0148200 | A1 | | 6/2011 | Burns et al. | |
| 2012/0140529 | A1 | | 6/2012 | Jin et al. | |
| 2012/0212861 | A1 | | 8/2012 | Menegoli et al. | |
| 2015/0280416 | A1 | | 10/2015 | Kreuter et al. | |
| 2017/0033788 | A1 | * | 2/2017 | Fujii | H02M 3/156 |
| 2018/0375325 | A1 | | 12/2018 | Lofthouse et al. | |
| 2019/0115835 | A1 | * | 4/2019 | Cohen | H02M 3/1588 |
| 2019/0260284 | A1 | * | 8/2019 | Liu | H02M 1/15 |
| 2021/0344271 | A1 | | 11/2021 | Tao | |

* cited by examiner

*Primary Examiner* — Tuan T Lam
(74) *Attorney, Agent, or Firm* — Crowe & Dunlevy LLC

(57) ABSTRACT

A load driver includes an active clamping circuit coupled between gate and source terminals of a power stage. The active clamping circuit serves to either pass through a gate drive voltage (provided by a gate driver) to the power stage in a PWM mode or to actively clamp the voltage between gate and source terminals of the power stage to enable fast decay recirculation in fast decay mode (when the load driver is configured for active clamping). A semi-active recirculation driver is coupled between ground and the output of the power stage. The semi-active recirculation driver serves to either provide a low impedance recirculation path in the PWM mode or to passively clamp the output voltage to provide for a fast decay recirculation path in fast decay mode (when the load driver is configured for passive clamping).

22 Claims, 11 Drawing Sheets

INDUCTIVE LOAD DRIVER WITH PWM REGULATION AND FAST SHUT DOWN CURRENT DECAY

TECHNICAL FIELD

This disclosure relates to the field of electronic circuit design and, more specifically, relates to techniques for managing energy in inductive loads, particularly during the transition phases of power converters driving those inductive loads.

BACKGROUND

Inductive load drivers are commonly used in electronic circuits to drive loads that have inductive characteristics, such as motors, solenoids, and transformers. These loads are characterized by their tendency to resist changes in current, which can lead to potentially damaging voltage spikes when the current is suddenly changed or interrupted. A common challenge in these applications is therefore the management of energy stored in these loads, especially during the transition phases of the power converter driving the load.

One common approach to management of the energy stored in an inductive load involves the use of a standard diode connected to ground to provide for decay of the energy. However, this may not be sufficiently rapid for certain applications, leading to the potential for damage to the components. Therefore, other techniques have been developed.

For example, by clamping the output of the power transistor of the power converter to a large negative voltage, the energy stored in an inductive load may be quickly dissipated. Complicating the issue is that gate drivers to drive the power transistor of the power converter are commonly designed in a way that requires connection to both the gate and source of the power transistor, and the absolute maximum rating (AMR) of the pin connected to the source of the power transistor limits the magnitude of the clamping voltage that may be safely used—for example, the AMR may be on the order of −1V to −14V, whereas a clamping voltage of −24V or lower would be desirable.

Therefore, there exists a need for techniques to effectively manage the decay of energy in inductive loads, particularly in high-demand applications, without exceeding the AMR of the gate driver components and providing for the reliability and longevity of the system.

SUMMARY

Disclosed herein is a load driver for an inductive load, including: a power stage having an input connected to a battery and having an output for driving the inductive load; a gate driver having a first driving pin coupled to a first terminal of the power stage, and a second driving pin coupled to a second terminal of the power stage, wherein the gate driver is configured to generate drive signals for driving the power stage; and a semi-active recirculation driver.

The semi-active recirculation driver is configured to: in a pulse width modulation (PWM) mode, activate circuitry to perform slow-decay of energy from the inductive load during off-times in the PWM cycle by creating a low impedance recirculation path; in a fast decay mode of an active clamping hardware configuration, deactivate the circuitry that performs the slow-decay of energy from the inductive load during off-times in the PWM cycle and replace it with a high impedance recirculation path; and in a fast decay mode of a passive clamping hardware configuration, deactivate the circuitry that performs the slow-decay of energy from the inductive load during off-times in the PWM cycle while diverting current to recirculate through a passive device with sufficient voltage drop.

An active clamping circuit is configurable to, in an active clamping hardware configuration, perform fast decay of energy from the inductive load at load switchoff by generating a voltage across the first and second terminals of the power stage sufficient to maintain a power transistor in the power stage as being turned on into saturation, establishing: a primary energy dissipation path from the inductive load to ground, and from ground to the battery, and from the battery to the power stage back to the inductive load; and a secondary energy dissipation path from the inductive load to ground, and from the ground into the active clamping circuit to thereby cause generation of the voltage across the first and second terminals of the power stage to maintain the power transistor in the power stage as being turned on into saturation.

The active clamping circuit is further configurable to, in a passive clamping hardware configuration, perform fast decay of energy from the inductive load at load switchoff by shorting the first and second terminals of the power stage so as to maintain the power transistor in the power stage as being turned off into cutoff, establishing: a primary energy dissipation path from the inductive load to ground, from ground into the semi-active recirculation driver, and from the semi-active recirculation driver back to the inductive load; and a secondary energy dissipation path from the inductive load to ground, and from the ground into the active clamping circuit to thereby cause shorting of the first and second terminals of the power stage to maintain the power stage as being turned off.

Similarly, disclosed herein is a method for operating a load driver for an inductive load. The method includes configuring a gate driver to generate drive signals for driving a power stage that has an input connected to a battery and an output for driving the inductive load. The method also includes configuring a semi-active recirculation driver to: in a pulse width modulation (PWM) mode, activate circuitry to perform slow-decay of energy from the inductive load during off-times in the PWM cycle by creating a low impedance recirculation path; in a fast decay mode of an active clamping hardware configuration, deactivate the circuitry that performs the slow-decay of energy from the inductive load during off-times in the PWM cycle and replace it with a high impedance recirculation path; and in a fast decay mode of a passive clamping hardware configuration, deactivate the circuitry that performs the slow-decay of energy from the inductive load during off-times in the PWM cycle while diverting current to recirculate through a passive device with sufficient voltage drop.

The method further includes configuring an active clamping circuit to, in an active clamping hardware configuration, perform fast decay of energy from the inductive load at load switchoff by generating a voltage across first and second terminals of the power stage sufficient to maintain a power transistor in the power stage as being turned on into saturation, thereby establishing: a primary energy dissipation path from the inductive load to ground, and from ground to the battery, and from the battery to the power stage back to the inductive load; and a secondary energy dissipation path from the inductive load to ground, and from the ground into the active clamping circuit to thereby cause generation of the voltage across the first and second terminals of the power stage to maintain the power transistor in the power stage as being turned on into saturation.

The method additionally includes configuring an active clamping circuit to, in a passive clamping hardware configuration, perform fast decay of energy from the inductive load at load switchoff by shorting the first and second terminals of the power stage so as to maintain the power transistor in the power stage as being turned off into cutoff, establishing: a primary energy dissipation path from the inductive load to ground, from ground into the semi-active recirculation driver, and from the semi-active recirculation driver back to the inductive load; and a secondary energy dissipation path from the inductive load to ground, and from the ground into the active clamping circuit to thereby cause shorting of the first and second terminals of the power stage to maintain the power stage as being turned off.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned, except for resistor R7 within the power stage, is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

In general, the inductive load driver design described herein provides for fast decay through an active or passive clamping circuit, while protecting pins of the gate driver from excessive negative voltages.

Figure 1:
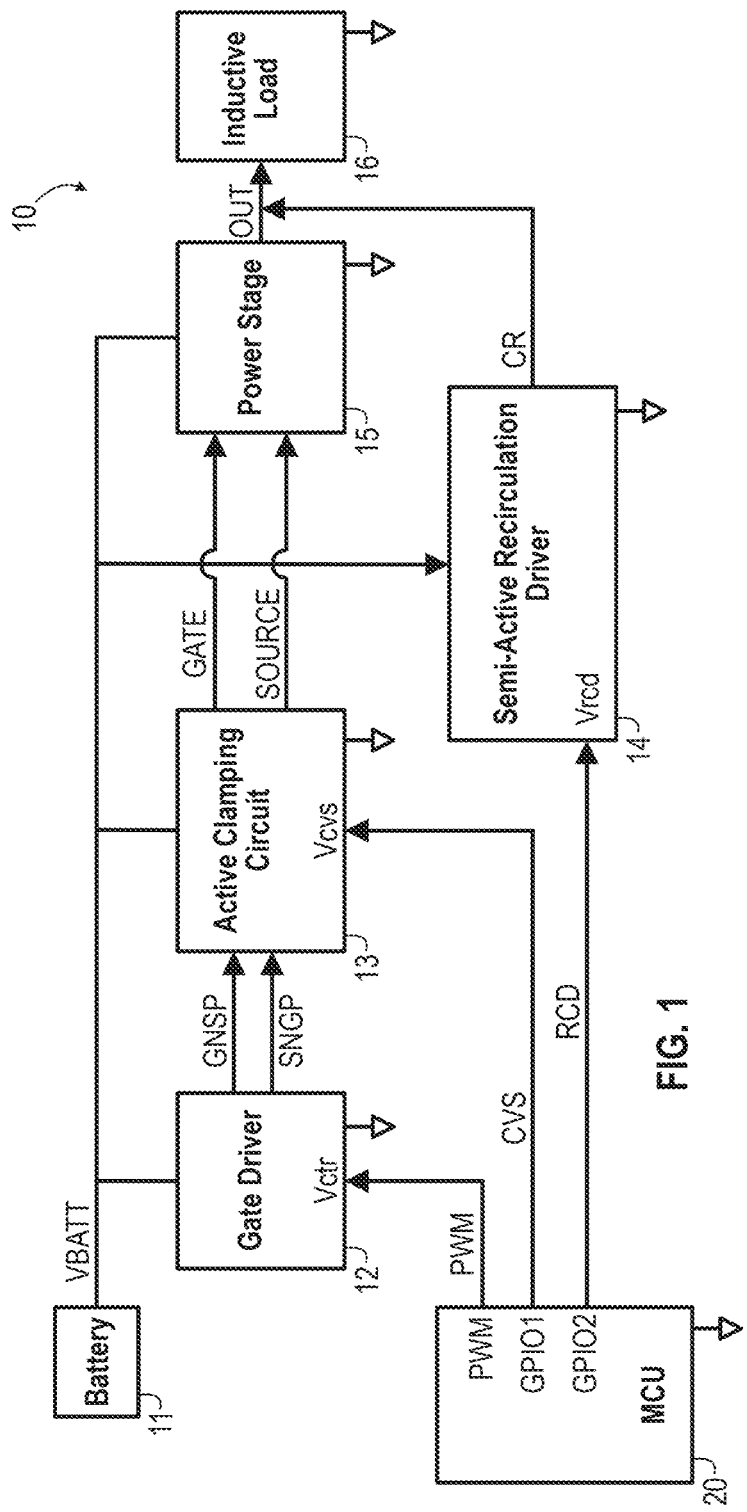
FIG. 1 is a block diagram of an inductive load driver disclosed herein.

With reference to FIG. 1, the inductive load driver 10 is now described. The inductive load driver 10 includes a power stage 15 (e.g., containing at least one power MOS transistor) connected between a battery 11 (to provide a battery voltage VBATT) and an inductive load 16. A gate driver 12, under control of a pulse width modulation (PWM) signal from a microcontroller (MCU) 20, generates control signals GNSP and SNGP which are respectively coupled to a gate terminal and a source terminal of the power stage 15. An active clamping circuit 13 is coupled between the gate terminal and the source terminal of the power stage 15 and, as will be described, serves to either pass through the gate drive voltage (from output of the Gate Driver 12 across GNSP and SNGP to the input of the Power Stage 15 across GATE and SOURCE) in PWM mode or to actively clamp the voltage at input of the Power Stage 15 across GATE and SOURCE to enable fast decay current recirculation in Fast Decay mode (when the circuit is configured for Active Clamping). A semi-active recirculation driver 14 is coupled between the ground and the output OUT of the power stage 15 and, as will be described, this semi-active recirculation driver 14 serves to either provide a low impedance recirculation path in PWM mode or to passively clamp the output voltage OUT to provide for a fast decay current recirculation path in Fast Decay mode (when the circuit is configured for Passive Clamping).

In operation, the MCU 20 controls the gate driver 12, active clamping circuit 13, and semi-active recirculation driver 14 so as to operate the power stage 15 in either pulse width modulation (PWM) mode or in fast decay mode (in which active or passive clamping is performed at load switchoff).

During operation in PWM mode and in the off period of the PWM cycles, the energy from the inductive load 16 is recirculated through a low impedance recirculation path from ground back to the inductive load provided within a portion of the semi-active recirculation driver 14, which is activated during operation in PWM mode but turned off in fast decay mode. This recirculation in PWM mode, when the load is on (load demand is present), can sufficiently provide for safe operation and prevent overvoltages on the pins of the gate driver 12.

When the load is switched off exiting PWM mode, performance of a fast decay of the inductive load current is desirable (while maintaining the voltage at the pins of the gate driver 12 at safe levels), as it allows for a quick dissipation of the energy within the inductive load. Fast decay may be performed via either active clamping or passive clamping, as stated above.

Figure 2:
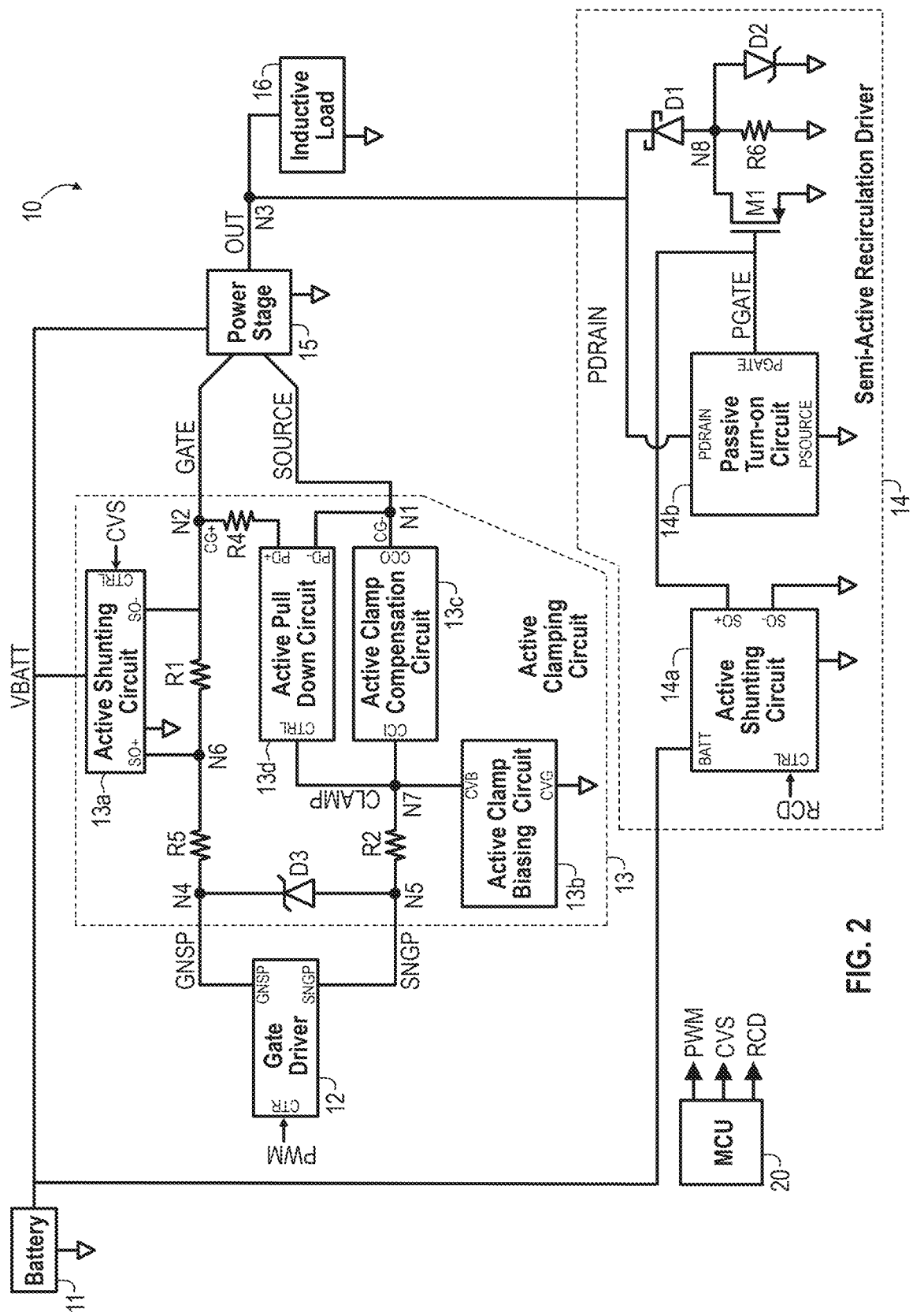
FIG. 2 is a schematic block diagram of the inductive load driver of FIG. 1.

Further details of an example implementation of the inductive load driver 10 will be given with reference to FIG. 2. The gate driver 12 outputs control signals GNSP and SNGP to nodes N4 and N5 within the active clamping circuit 13.

The active clamping circuit 13 is now described and includes a Zener diode D3 having its cathode connected to node N4 and its anode connected to node N5. A resistor R5 is connected between nodes N4 and N6, a resistor R1 is connected between nodes N6 and N2; note that node N2 is connected to the gate terminal of the power stage 15. A resistor R2 is connected between nodes N5 and N7. An optional active shunting circuit 13*a* is coupled between the battery 11 and ground, has terminals connected to nodes N6 and N2, and is controlled by signal CVS received from microcontroller 20. An active clamp biasing circuit 13*b* is coupled between node N7 and ground. An active clamp compensation circuit 13*c* is coupled between nodes N7 and N1; note that node N1 is connected to the source terminal of the power stage 15. An active pull down circuit 13*d* is coupled between nodes N1 and node N2, with the coupling to node N2 being through resistor R4.

The semi-active recirculation driver 14 is coupled from ground to node N3 at the output OUT of the power stage 15. The semi-active recirculation driver 14 is now described, and includes a Schottky diode D1 having its cathode connected to node N3 and its anode connected to node N8. A Zener diode D2 (populated only for Passive Clamping hardware configuration) has its anode connected to node N8 and its cathode connected to ground. A (high impedance) resistor R6 is connected between node N8 and ground. A p-channel transistor M1 has its drain connected to node N8, its source connected to ground, and its gate coupled to receive the PGATE signal formed thereon. An active shunting circuit 14*a* has its output coupled between the node PGATE and ground, is controlled by the RCD signal received from MCU 20, and receives supply voltage from VBATT. A passive turn-on circuit 14*b* is coupled between node N3 and ground, and provides output to the gate of the p-channel transistor.

Figure 2A:
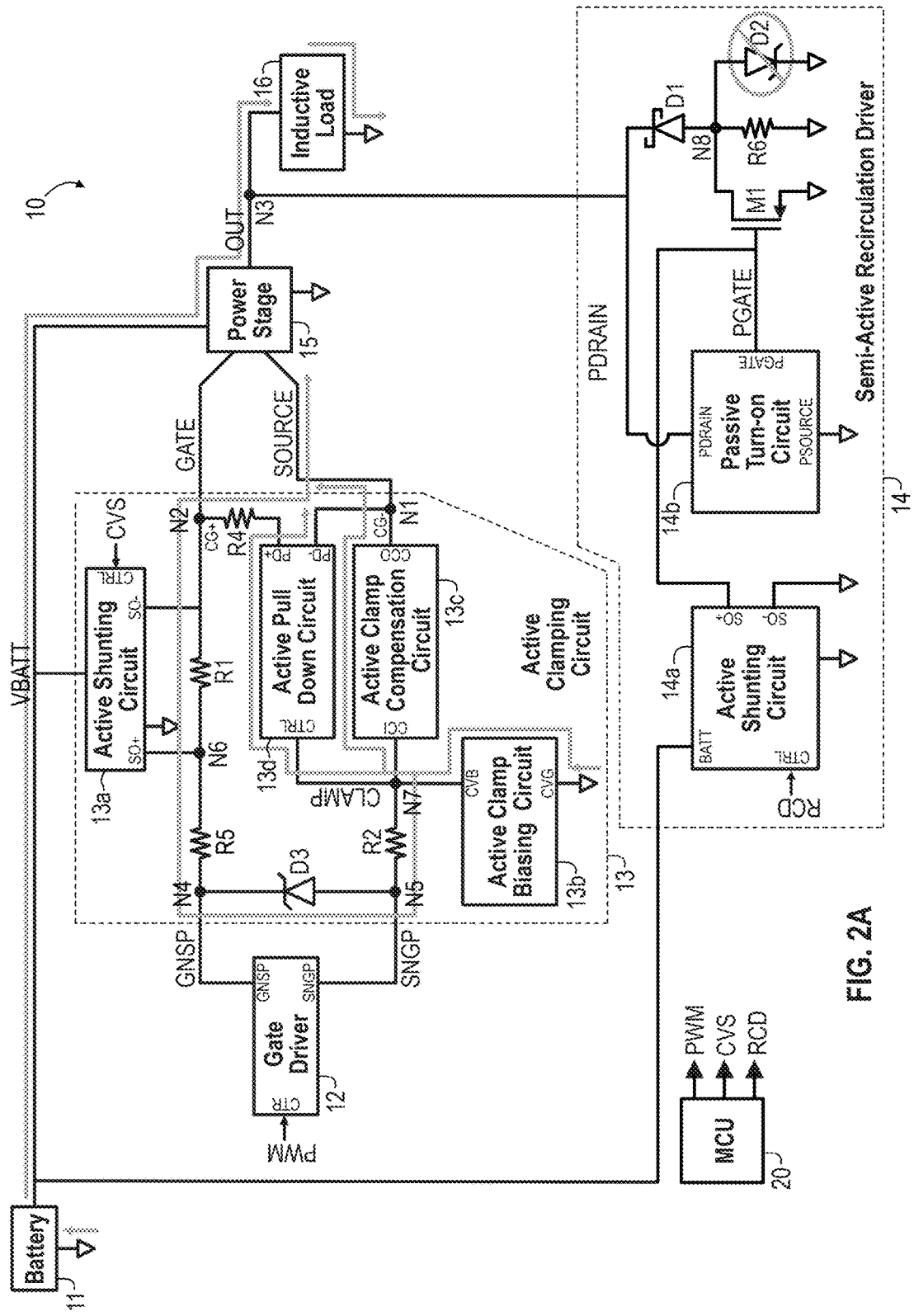
FIG. 2A is a schematic block diagram of the inductive load driver of FIG. 1, with energy dissipation paths and circuit modifications shown for operation when performing active clamping.

General operation to perform active clamping is now described with reference to FIG. 2A. Active clamping is generally preferable when the battery voltage VBATT is at a lower level (appreciably lower than the output clamping voltage, e.g., 36V), such as 12V, or, in some cases, 24V. Of note is that when the inductive load driver 10 is configured for active clamping, diode D2 is not populated in the device (e.g., is not present) and that resistor R6 in the semi-active recirculation driver 14 has a high resistance value.

To enable fast decay with active clamping, the active shunting circuit 14*a* turns off transistor M1, and the gate driver 12 shuts off (nodes GNSP and SNGP are low impedance shorted internally within gate driver 12). Energy dissipation occurs as current flows on a path from the inductive load 16, to ground, back to the battery 11, then through the power transistor of the power stage 15, and back to inductive load 16—this is the main recirculation path for energy dissipation during active clamping.

Another path for energy dissipation is from the inductive load 16, to ground, through the active clamp biasing circuit 13*b* to node N7. Assuming that the voltage at node N1, which is low impedance shorted to output OUT node through resistor R7 in power stage 15, is at a substantially negative value, for example −36V. Since ground is at 0V, the voltage at node N7 as a result of the current flow through the active clamp biasing circuit 13*b* will be a negative value that is less negative than the value at node N1, for example −5V.

This creates a positive voltage differential between nodes N7 and N1. This voltage differential drives current flow through resistor R2 to node N5, and through Zener diode D3 to node N4. The current path continues through resistor R5 to node N6, through resistor R1 if the active shunting circuit 13*a* is deactivated via CVS to node N2 but from node N6 to node N2 if the active shunting circuit 13*a* is activated via CVS. The current path continues through resistor R4, through the active pull down circuit 13*d*, back to node N1. The action of the active pull down circuit 13*d* connecting the lower terminal of R4 to node N1 serves to establish a voltage between node N2 and node N1—the gate to source voltage—that maintains the power transistor within the power stage 15 in the saturation region during active clamping.

Further current flow caused by the voltage differential between nodes N7 and N1 is from node N7, through the active clamp compensation circuit 13*c* to node N1, and also from node N7 through the active pull down circuit 13*d* to node N1.

It should be appreciated that the majority of the energy dissipation during active clamping is through the inductive load 16 to ground, back to the battery 11, and through the output stage, as stated. The rest of the energy dissipation is in the active clamping circuit 13. As will be explained later when the specifics of the active clamp compensation circuit 13*c* are provided, the majority of the energy dissipated within the active clamping circuit 13 may be within the active clamp compensation circuit 13*c*, and the distribution between the power dissipation in the output stage 15 and the power dissipation in the active clamp compensation circuit 13*c* may be adjusted based on the single pulse energy handling capabilities of the power transistor within the power stage 15.

Figure 2B:
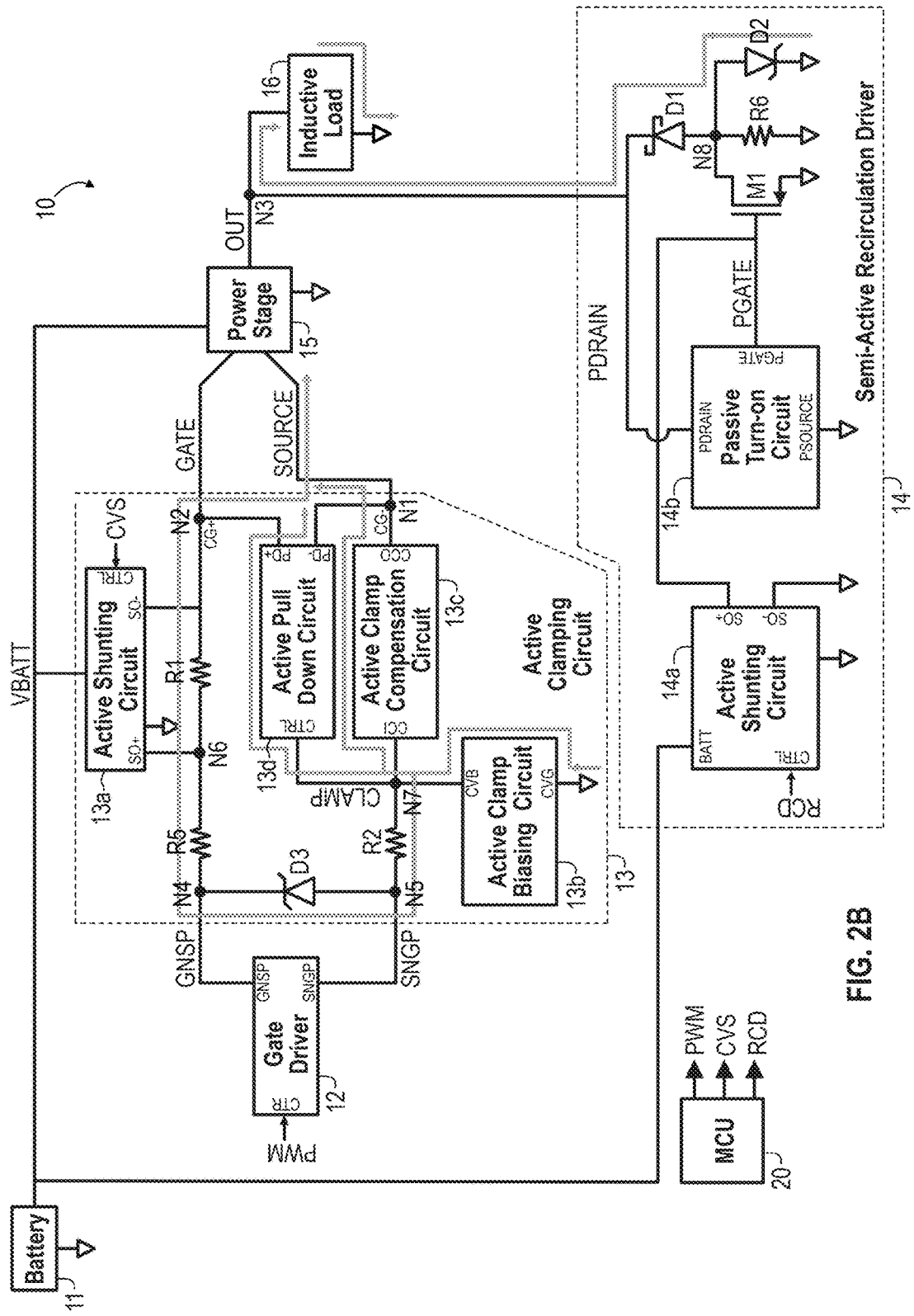
FIG. 2B is a schematic block diagram of the inductive load driver of FIG. 1, with energy dissipation paths and circuit modifications shown for operation when performing passive clamping.

General operation to perform passive clamping is now described with reference to FIG. 2B. Passive clamping is generally preferable when the battery voltage VBATT is at a high level (higher than the output clamping voltage, e.g., 36V), such as 48V.

Of note is that when the inductive load driver 10 is configured for passive clamping, resistor R4 is not populated in the device (e.g., is not present and is instead replaced with a short), and Zener diode D2 in the semi-active recirculation driver 14 is populated.

To enable fast decay with passive clamping, the active shunting circuit 14*a* turns off transistor M1 and the gate driver 12 shuts off (nodes GNSP and SNGP are low impedance shorted internally within gate driver 12). Energy dissipation occurs as the inductive load current flowing on a path from the inductive load 16, to ground, and from ground through diode D2 to node N8, through Schottky diode D1, and back to the inductive load 16—this is the main path for energy dissipation during passive clamping.

It shall be noted that a very small portion of the inductive load current flows from the inductive load 16, to ground, through the active clamp biasing circuit 13*b* to node N7. Assuming that the voltage at node N1, which is low impedance shorted to output OUT node through resistor R7 in power stage 15, is at a substantially negative value, such as −36V, and since ground is at 0V, the voltage at node N7 as a result of the current flowing through the Active Clamp Biasing circuit 13*b* will be a negative value that is less negative than the value at node N1, for example 5V. This creates a positive voltage differential between nodes N7 and N1. This voltage differential drives current flow through resistor R2 to node N5, and though Zener diode D3 to node N4. The current path continues through resistor R5 to node N6, through resistor R1 if the active shunting circuit 13*a* is deactivated via CVS to node N2 but from node N6 to node N2 if the active shunting circuit 13a is activated via CVS. The current path continues through the active pull down circuit 13d, back to node N1. The action of the active pull down circuit 13d pulling down node N2 to node N1 serves to short the gate and source of the power transistor in the power stage 15. This turns off the power transistor in the power stage 15 and maintains the power transistor in the power stage 15 as being in the cutoff region during passive clamping, so that, as stated, the majority of energy dissipation is through diodes D2 and D1.

Further current flow caused by the voltage differential between nodes N7 and N1 is from node N7, through the active clamp compensation circuit 13c to node N1, and also from node N7 through the active pull down circuit 13d to node N1. But energy dissipation by these two paths is significantly lower compared to that through diodes D2 and D1.

Figure 3:
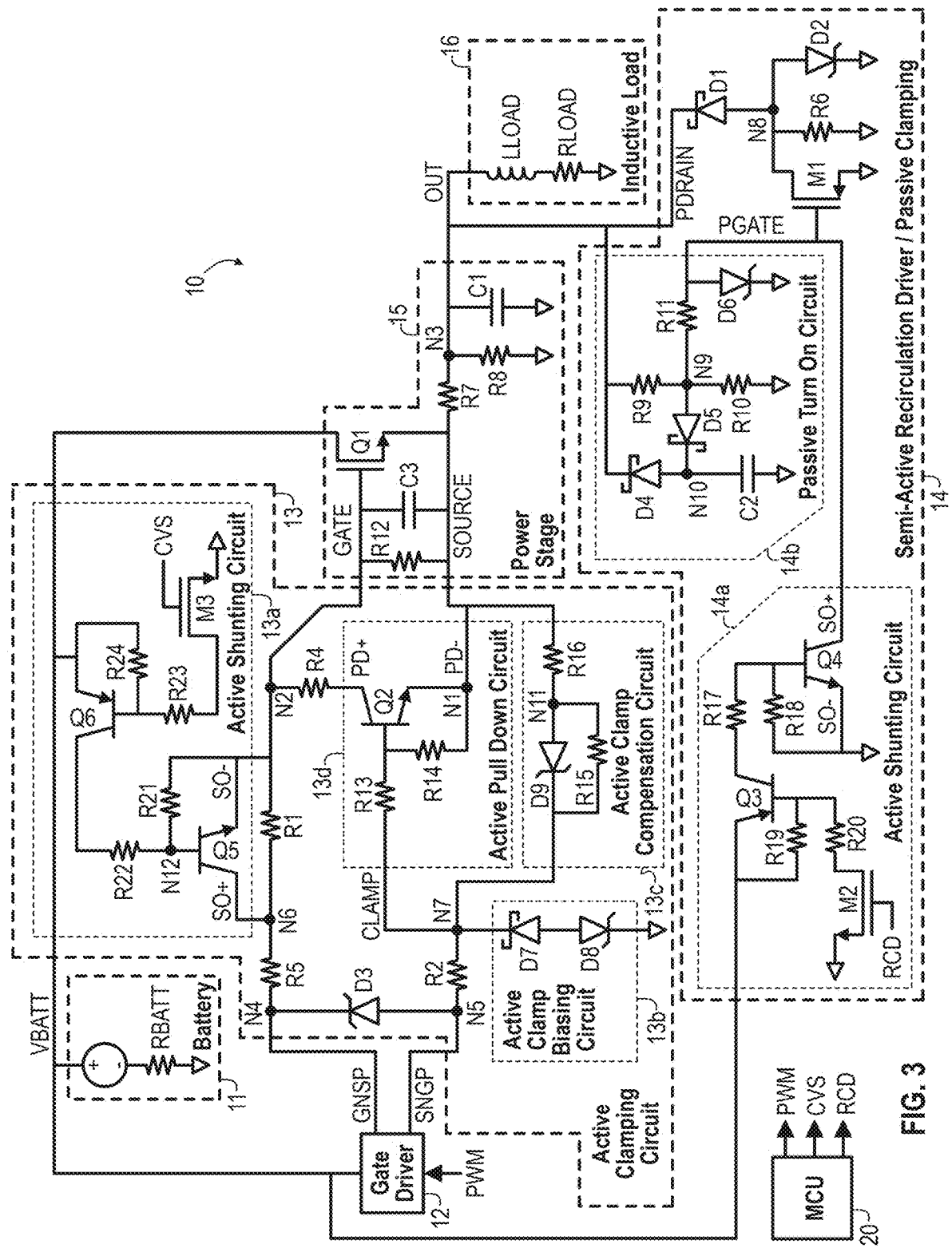
FIG. 3 is a schematic diagram of the inductive load driver of FIG. 1.

An example full component level implementation is now described with reference to FIG. 3.

The power stage 15 includes an n-channel power transistor Q1 having its drain coupled to receive the battery voltage VBATT from the battery 11, its source connected to node N1, and its gate connected to node N2. Also included is a resistor R12 connected between nodes N2 and N1, a capacitor C3 connected between nodes N2 and N1, a resistor R7 connected between nodes N1 and N3, a resistor R8 connected between nodes N3 and ground, and a capacitor C1 connected between node N3 and ground.

The gate driver 12 may be any suitable driver understood by one of ordinary skill in the art and is coupled to provide control signal GNSP to node N4 and provide control signal SNGP to node N5.

The active clamping circuit 13 includes a Zener diode D3 with its cathode connected to node N4 and its anode connected to node N5, with resistor R5 connected between nodes N4 and N6, resistor R1 connected between nodes N6 and N2, and resistor R2 connected between nodes N5 and N7. The active clamping circuit 13 includes an active shunting circuit 13a connected to the battery 11, node N6, and node N2, an active clamp biasing circuit 13b connected between nodes N7 and ground, an active clamp compensation circuit 13c connected between nodes N7 and N1, and an active pull down circuit 13d connected between nodes N2 and N1, with the connection to node N2 being through resistor R4.

The active shunting circuit 13a includes NPN transistor Q5 having its emitter connected to node N2, its collector connected to node N6, and its base connected to node N12. The active shunting circuit 13a further includes resistor R21 connected between nodes 12 and N2, and resistor R22 connected between node N12 and the collector of PNP transistor Q6. PNP transistor Q6 has its emitter connected to the battery 11 and has its base connected to its emitter through resistor R24 as well as to the drain of n-channel transistor M3 through resistor R23. N-channel transistor M3 has its source connected to ground and its gate coupled to receive the CVS signal.

The active clamp biasing circuit 13b includes Schottky diode D7 having its cathode connected to node N7 and its anode connected to the anode of Zener diode D8, which has its cathode connected to ground.

The active clamp compensation circuit 13c includes resistor R16 connected between node N1 and node N1, resistor R15 connected between node N7 and node N11, Zener diode D9 having its anode connected to node N11 and its cathode connected to node N7.

The active pull down circuit 13d includes NPN transistor Q2 having its collector connected to resistor R4, its emitter connected to node N1, and its base connected to its emitter through resistor R14. Resistor R13 is connected between the base of Q2 and node N7.

The semi-active recirculation driver 14 includes an active shunting circuit 14a connected between the battery 11 and the gate of p-channel transistor M1, and a passive turn on circuit 14b connected between the gate of p-channel transistor M1 and node N3. P-channel transistor M1 has its drain connected to node N8 and its source connected to ground. A resistor R6 is connected between node N8 and ground, and a Zener diode D2 has its anode connected to node N8 and its cathode connected to ground. A Schottky diode D1 has its anode connected to node N8 and its cathode connected to node N3.

The active shunting circuit 14a includes NPN transistor Q4 having its collector connected to the gate of p-channel transistor M1, having its emitter connected to ground, and having its base connected to ground through resistor R18. The active shunting circuit 14a further includes resistor R17 connected between the base of NPN transistor Q4 and the collector of PNP transistor Q3. The emitter of PNP transistor Q3 is connected to the battery 11, and is connected to its base through resistor R19. Resistor R20 is connected between the base of PNP transistor Q3 and the drain of n-channel transistor M2. The source of n-channel transistor M2 is connected to ground, and the gate of n-channel transistor M2 is coupled to signal RCD.

The passive turn on circuit 14b includes a Schottky diode D4 having its cathode connected to node N3 and its anode connected to node N10. A capacitor C2 is connected between node N10 and ground. A resistor R9 is connected between node N3 and node N9, and a resistor R10 is connected between node N9 and ground. A Schottky diode D5 has its anode connected to node N9 and its cathode connected to node N10. A resistor R11 is connected between node N9 and the gate of p-channel transistor M1, and a Zener diode D6 has its anode connected to the gate of p-channel transistor M1 and its cathode connected to ground.

Figure 4:
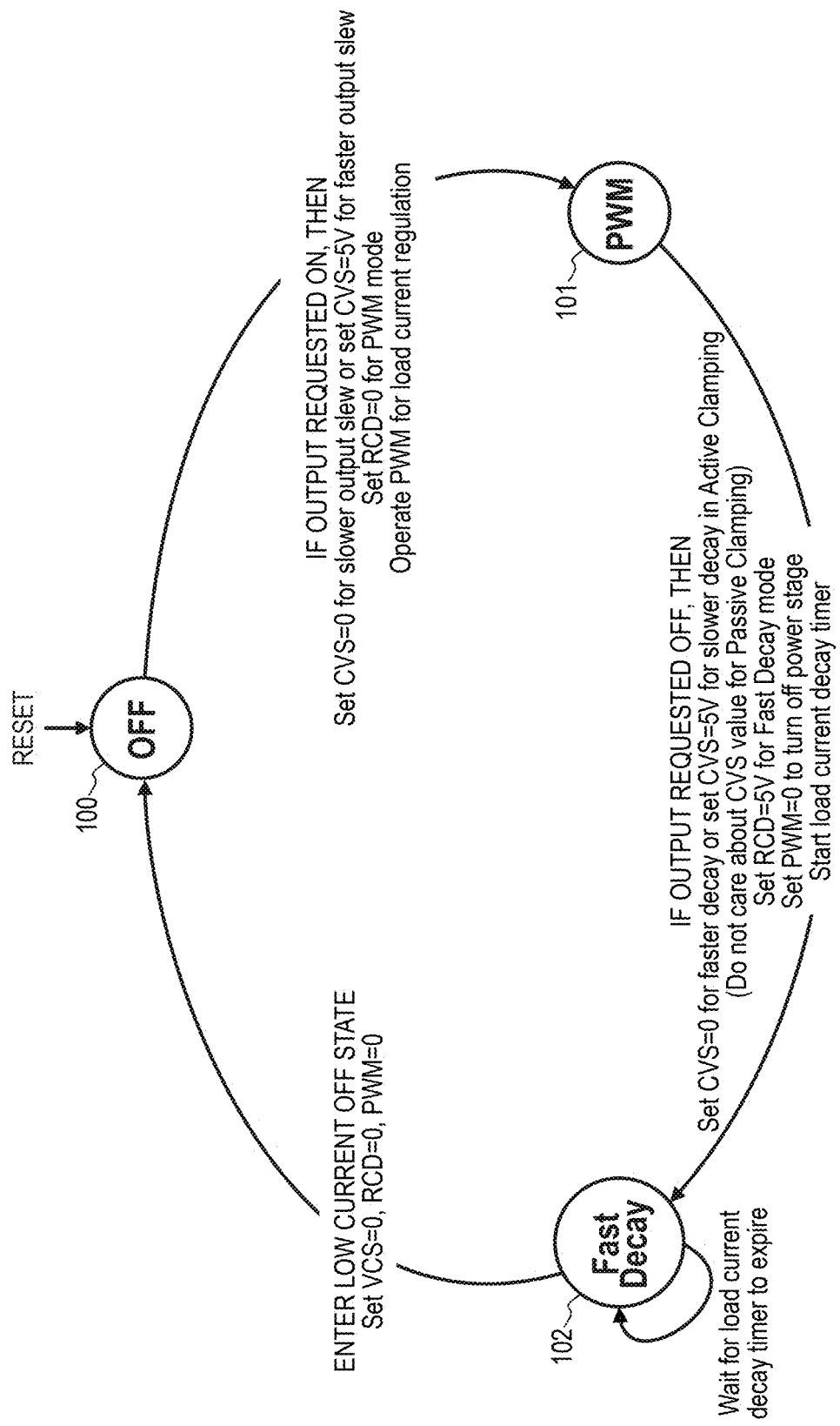
FIG. 4 is a state diagram showing operation of the inductive load driver of FIG. 1.

More detailed operation will now be described with additional reference to the state diagram of FIG. 4 showing operation of the MCU 20 of FIGS. 2-3.

Starting from an initial condition (State 100), a power-on reset (or a power-on in the case of startup) is performed by the MCU 20, and MCU 20 then proceeds to start operation in PWM mode. Here, the MCU 20 deasserts RCD to activate PWM load current circulation and generates the PWM signal so as to cause the gate driver 12 to suitably drive the power stage 15 to supply the inductive load 16 in PWM mode (State 101).

Referring now to the semi-active recirculation driver 14, the deassertion of RCD by the MCU 20 at State 101 turns n-channel transistor M2 off, which has the effect of turning off PNP transistor Q3 so that NPN Q4 remains off. During the off-periods of the PWM, a low impedance path is formed through the ground connection between the inductive load 16 and the capacitor C2, and through D4. This serves to charge capacitor C2 with a negative voltage, which ultimately serves to provide a negative voltage at the gate of M1, turning transistor M1 on during PWM.

Also at State 101, the MCU 20 may deassert CVS for a slower output slew rate or assert CVS for a faster output slew. Referring to the active clamping circuit 13, the deassertion of CVS serves to turn off n-channel transistor M3, having the effect of turning off PNP transistor Q6, and in turn, turning off NPN transistor Q5 so that resistor R1 remains in the path between the gate of n-channel transistor Q1 and the GNSP pin of the gate driver 12. On the other hand, the assertion of CVS serves turn on n-channel transistor M3 to sink current from the base of PNP transistor Q6 to turn Q6 on, thereby sourcing current to the base of NPN transistor Q5 to turn Q5 on to shunt across resistor R1, removing resistor R1 from the path between the gate of n-channel transistor Q1 and the GNSP pin of the gate driver 12.

If load conditions change, or if a command is received to turn-off, then operation proceeds to State 102 for operation in fast decay mode, using either active clamping or passive clamping. To facilitate this, the MCU 20 asserts RCD and deasserts PWM to turn-off the power stage 15. Referring to the semi-active recirculation driver 14, the assertion of RCD by the MCU 20 turns on n-channel transistor M2, which then pulls the base of PNP transistor Q3 low to turn on Q3. As a result, transistor Q3 sources current to the base of NPN transistor Q4 to turn on Q4, which then shorts the gate of p-channel transistor M1 to ground, turning off transistor M1.

Figure 3A:
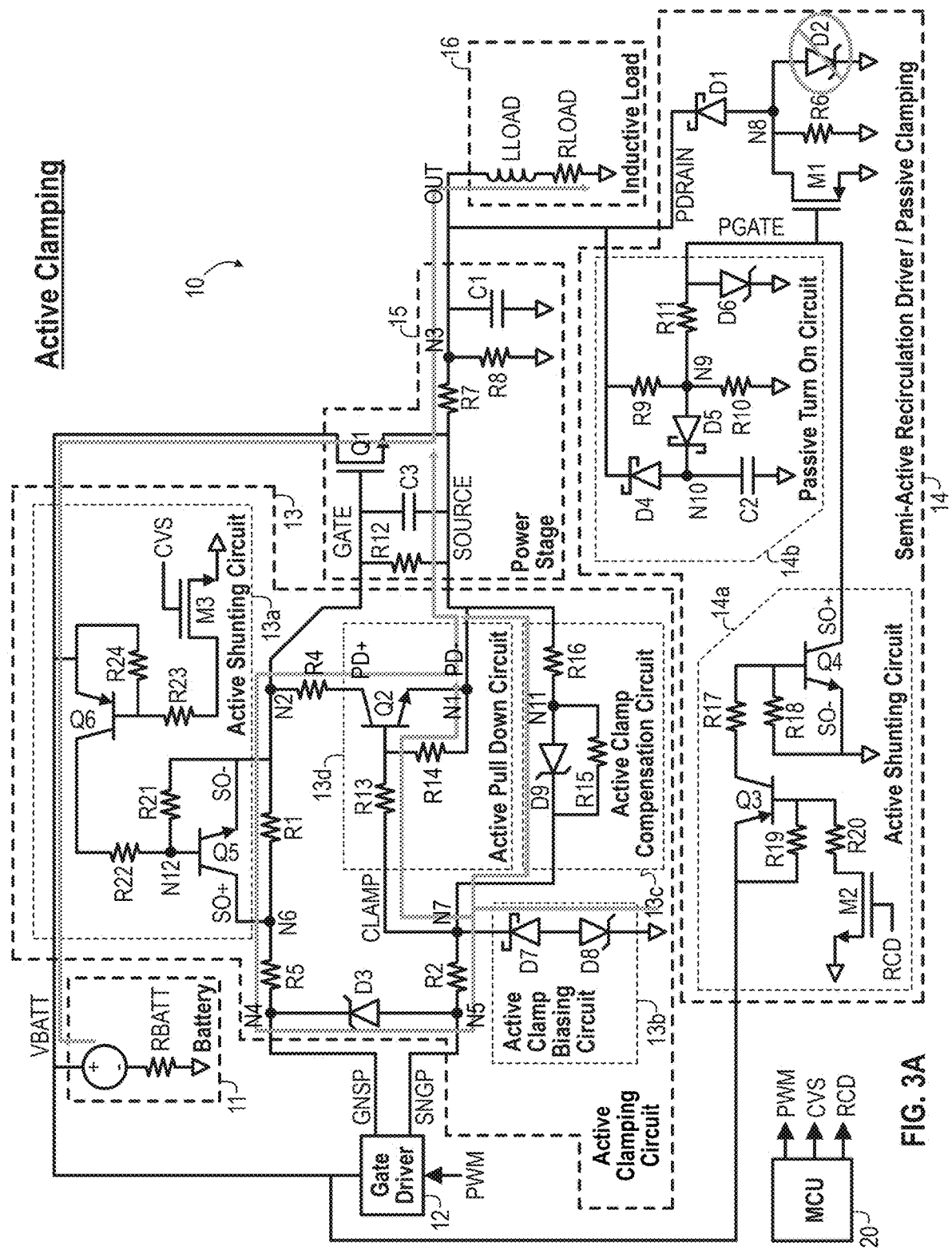
FIG. 3A is a schematic diagram of the inductive load driver of FIG. 1, with energy dissipation paths and circuit modifications shown for operation when performing active clamping.

Fast decay in either active clamping or passive clamping can then proceed. Fast decay in active clamping will now be described with reference to FIG. 3A. The gate driver 12 shuts off (nodes GNSP and SNGP are low impedance shorted internally within gate driver 12), and energy dissipation occurs as current flows on a path from the inductive load 16, to ground, back to the battery 11, then through the power transistor Q1 of the power stage 15, and back to inductive load 16—this is the main recirculation path for energy dissipation during active clamping.

Another path for energy dissipation is from the inductive load 16, to ground, then from ground up through Zener diode D8 and Schottky diode D7. Assuming that the voltage at node N1 is at a substantially negative value, since ground is at 0V, the voltage at node N7 as a result of the current flow through diodes D7 and D8 will be a negative value that is less negative than the value at node N1. This creates a positive voltage differential between nodes N7 and N1. This voltage differential drives current flow through resistor R2 to node N5, and through Zener diode D3 to node N4. The current path continues through resistor R5 to node N6, through resistor R1 if the active shunting circuit 13a is deactivated via CVS to node N2 but from node N6 to node N2 if the active shunting circuit 13a is activated CVS. The current path continues through resistor R4, through NPN transistor Q2 back to node N1. The connection of the lower terminal of R4 to node N1 by transistor Q2 serves to establish a voltage between node N2 and node N1—the gate to source voltage—that maintains the power transistor within the power stage 15 in the saturation region during active clamping.

Further current flow caused by the voltage differential between nodes N7 and N1 is from node N7, through Zener diode D9, resistor R15, and resistor R16 to node N1, and also from node N7 through resistors R13, R14, and the base-emitter junction of Q2 (which turns on Q2 and drives it into saturation region) to node N1.

Of interest in active clamping is that, in the active clamp compensation circuit 13c, the lower the resistance value of R16, the greater the amount of energy dissipated in resistor R16, and consequently the lower the amount of energy dissipated by the power transistor Q1. This way, the value of R16 can be tuned to match the power transistor Q1 so that, overall, the requisite energy dissipation can be met during active clamping. The addition of D9 and R15 is optional and serves to accelerate the decay of the tail current after Q1 exits the saturation region and enters cut off region at the end of the active clamping. For simplicity, all simulations are run assuming D9 and R15 are short circuited.

Figure 3B:
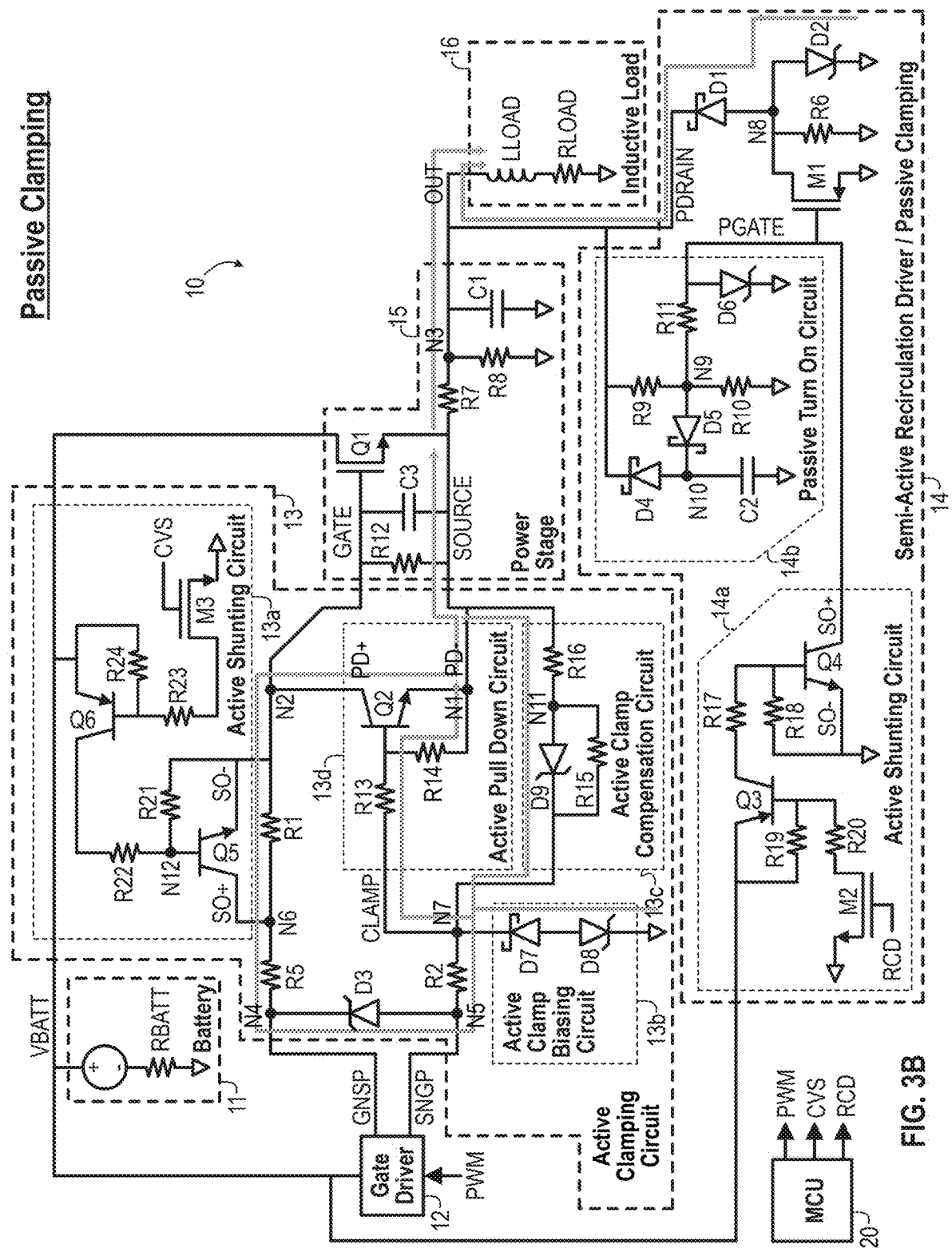
FIG. 3B is a schematic diagram of the inductive load driver of FIG. 1, with energy dissipation paths and circuit modifications shown for operation when performing passive clamping.

Fast decay in passive clamping will now be described with reference to FIG. 3B. The gate driver 12 shuts off (nodes GNSP and SNGP are low impedance shorted internally within gate driver 12). Energy dissipation occurs as the inductive load current flowing on a path from the inductive load 16, to ground, and from ground through Zener diode D2 to node N8, through Schottky diode D1, and back to the inductive load 16—this is the main path for energy dissipation during passive clamping.

A small portion of the inductive load current flows from the inductive load 16, to ground, through Zener diode D8 and Schottky diode D7 to node N7. Assuming that the voltage at node N1 is at a substantially negative value, and since ground is at 0V, the voltage at node N7 will therefore be a negative value that is less negative than the value at node N1. This creates a positive voltage differential between nodes N7 and N1. This voltage differential drives current flow through resistor R2 to node N5, and though Zener diode D3 to node N4. The current path continues through resistor R5 to node N6, through resistor R1 if the active shunting circuit 13a is deactivated via CVS to node N2 but from node N6 to node N2 if the active shunting circuit 13a is activated via CVS. The current path continues through NPN transistor Q2 (without the presence of resistor R4, which is not populated for passive clamping), back to node N1. The action of the NPN transistor Q2 pulling down node N2 to node N1 serves to short the gate and source of the power transistor in the power stage 15. This turns off the power transistor in the power stage 15 and maintains the power transistor in the power stage 15 as being in the cutoff region during passive clamping, so that, as stated, the majority of energy dissipation is through diodes D2 and D1.

Further current flow caused by the voltage differential between nodes N7 and N1 is from node N7, through the Zener diode D9, resistor R15, and resistor R16 to node N1, and also from node N7 through resistors R13, R14, and the base-emitter junction of Q2 (which turns on Q2 and drives it into saturation region) to node N1. But energy dissipation by these two paths is significantly lower compared to that through diodes D2 and D1.

The clamping voltage in the active clamping hardware configuration can be selected by the microcontroller 20. For a first, higher clamp voltage, the microcontroller 20 deasserts CVS, so that n-channel transistor M3 is turned off, having the effect of turning off PNP transistor Q6, and in turn, turning off NPN transistor Q5. For a second, lower clamp voltage, the microcontroller 20 asserts CVS, turning on n-channel transistor M3 to sink current from the base of PNP transistor Q6 to turn Q6 on, thereby sourcing current to the base of NPN transistor Q5 to turn Q5 on to shunt across resistor R1.

At the beginning of State 102, a load current decay timer is started, and once the load decay timer times out (e.g., reaches a desired value), operation proceeds back to the off or reset condition of State 100, in which the MCU 20 deasserts PWM, VCS, and RCD.

Figure 5:
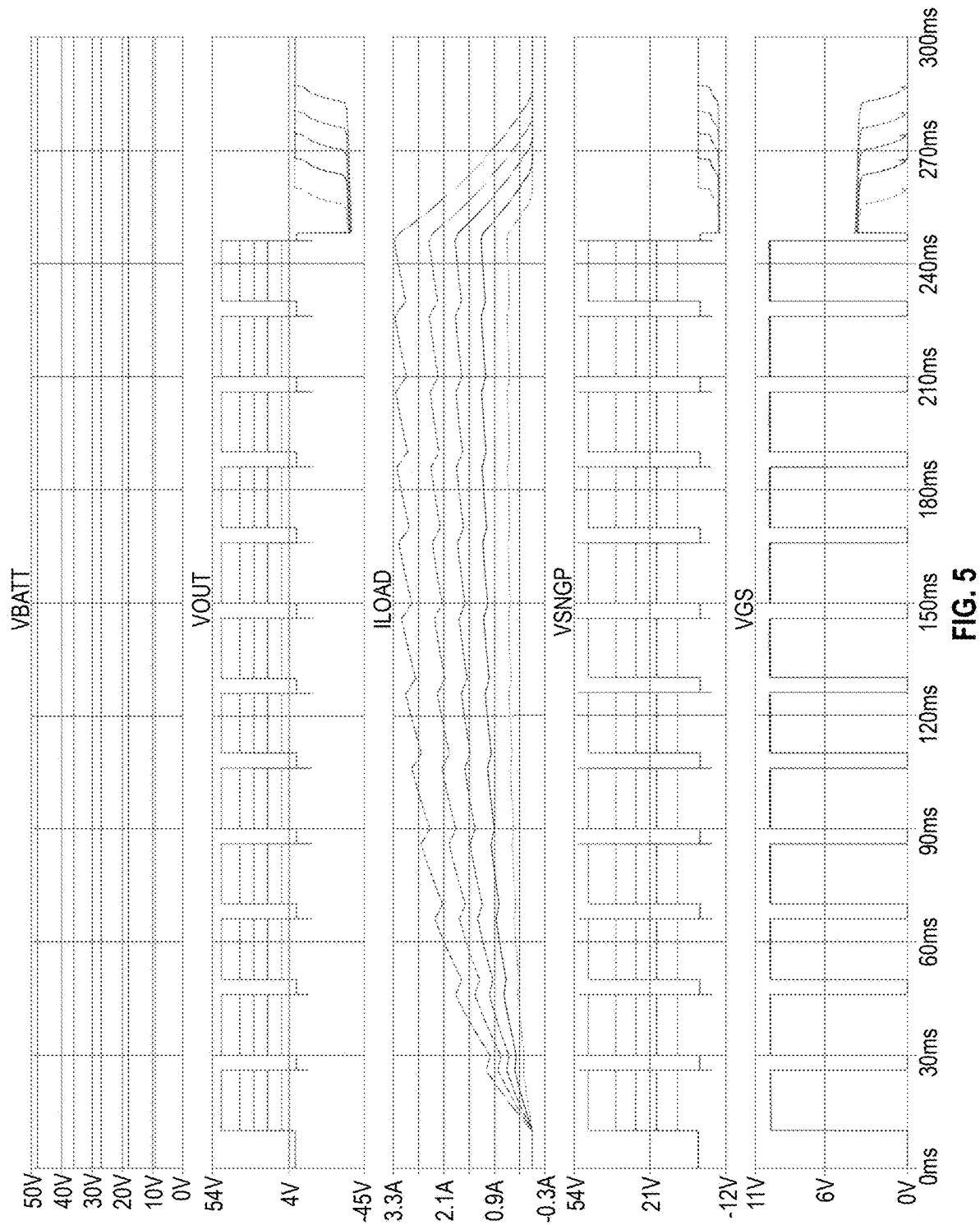
FIG. 5 is a graph showing the gate driver pin voltages and output voltage of the inductive load driver of FIG. 1 during operation in the active clamping configuration where VBATT is stepped at 9V, 18V, 27V, 36V, and 48V.
Figure 6:
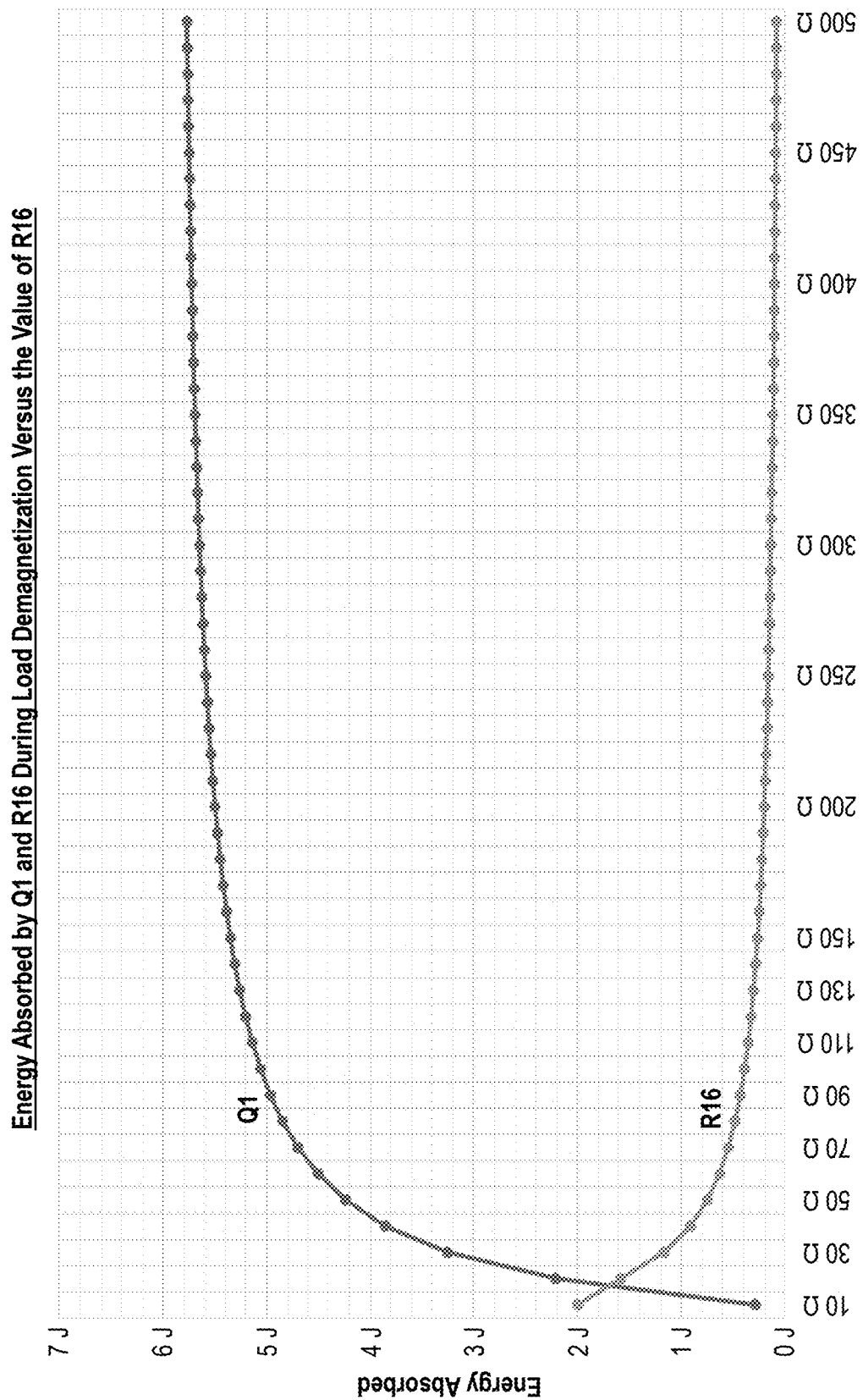
FIG. 6 is a graph showing the energy dissipation by transistor Q1 and resistor R16 of FIG. 3A during active clamping, for different resistance values of R16 at VBATT=48V.

Waveforms showing the effectiveness of the inductive load driver 10 in the active clamping hardware configuration may be found in FIG. 5, where the clamping of the output voltage (marked as VOUT in FIG. 5) of power stage 15 and the clamping of the SNGP voltage (marked as VSNGP in FIG. 5) of the gate driver 12 are presented along with a few other circuit parameters (VBATT for the battery voltage; ILOAD for the inductive load current; VGS for the gate to source voltage of the output stage transistor). Thus, in the active clamping hardware configuration, the inductive load driver 10 allows maintaining the voltage at the pins of the gate driver 12 within their absolute maximum ratings, while, as described, providing for on-the-fly selection between fast decay mode and PWM mode, and providing for dynamic selection from between two different clamping voltages. Additionally, recall that the proportion of energy dissipated by transistor Q1 and resistor R16 in active clamping hardware configuration may be altered by changing the resistance value of R16. This relationship is shown in FIG. 6, where it can be seen that as the resistance value of R16 becomes lower (particularly as it becomes lower than 70Ω or so), the proportion of power dissipated by R16 increases, with the crossover point being around 10 Ω.

Figure 7:
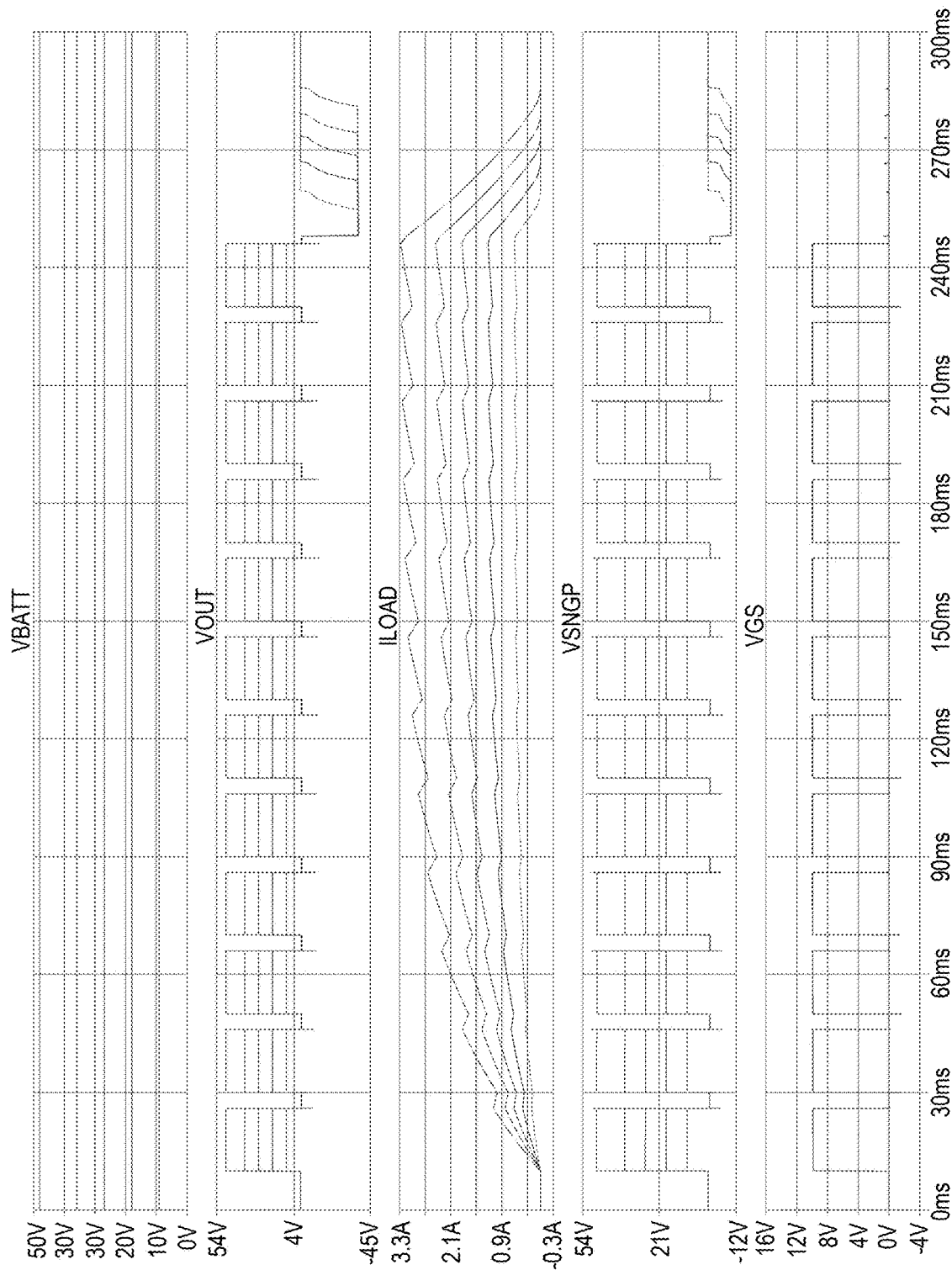
FIG. 7 is a graph showing the gate driver pin voltages and output voltage of the inductive load driver of FIG. 1 during operation in the passive clamping configuration where VBATT is stepped at 9V, 18V, 27V, 36V, and 48V.

Waveforms showing the effectiveness of the inductive load driver 10 in the passive clamping hardware configuration may be found in FIG. 7, where the clamping of the output voltage (marked as VOUT in FIG. 7) of power stage 15 and the clamping of the SNGP voltage (marked as VSNGP in FIG. 7) of the gate driver 12 are presented along with a few other circuit parameters (VBATT for the battery voltage; ILOAD for the inductive load current; VGS for the gate to source voltage of the output stage transistor). Thus, in the passive clamping hardware configuration the inductive load driver 10 also allows maintaining the voltage at the pins of the gate driver 12 within their absolute maximum ratings, while, as described, providing for on-the-fly selection between fast decay mode and PWM mode.

For active clamping, the output voltage VOUT at the output OUT of the power stage 15 in fast decay mode may be mathematically represented as:

$$VOUT = VCLAMP - \frac{VGS-VCE}{R4} \times R2 - VFD3 - \frac{VGS-VCE}{R4} \times (R1+R5) - VGS$$

Where VCLAMP is the voltage at node N7 (also labelled as node CLAMP), VGS is the gate to source voltage of transistor Q1 operating in the saturation region when the inductive load 16 is turned off (e.g., load demand ceases) in the fast decay mode, VFD3 is the forward voltage across Zener diode D3, and VCE is the collector to emitter voltage of transistor Q2 operating in the saturation region. The above equation assumes that CVS is deasserted; otherwise R1 would be shorted through by the active shunting circuit 13a (i.e., R1=0 in the above equation).

If R2=R4 and (R1+R5)=k×R4, then the equation can be simplified and written in terms of the desired output clamping voltage:

$$k = \frac{VOUT - VCLAMP + 2 \times VGS - VCE + VFD3}{VCE - VGS}$$

For passive clamping, the output voltage VOUT at the output OUT of the power stage 15 in fast decay mode is primarily determined by D2.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A load driver for an inductive load, comprising:
   a power stage having an input connected to a battery and having an output for driving the inductive load;
   a gate driver having a first driving pin coupled to a first terminal of the power stage, and a second driving pin coupled to a second terminal of the power stage, wherein the gate driver is configured to generate drive signals for driving the power stage;
   a semi-active recirculation driver configured to:
      in a pulse width modulation (PWM) mode, activate circuitry to perform a slow-decay of energy from the inductive load during off-times in the PWM cycle by creating a low impedance recirculation path;
      in a fast decay mode of an active clamping hardware configuration, deactivate the circuitry that performs the slow-decay of energy from the inductive load during off-times in the PWM cycle and replace it with a high impedance recirculation path; and
      in a fast decay mode of a passive clamping hardware configuration, deactivate the circuitry that performs the slow-decay of energy from the inductive load during off-times in the PWM cycle while diverting current to recirculate through a passive device with sufficient voltage drop; and
   an active clamping circuit configurable to, in the active clamping hardware configuration, perform a fast decay of energy from the inductive load at load switchoff by generating a voltage across the first and second terminals of the power stage sufficient to maintain a power transistor in the power stage as being turned on into saturation, establishing:
      a primary energy dissipation path from the inductive load to ground, and from ground to the battery, and from the battery to the power stage back to the inductive load; and
      a secondary energy dissipation path from the inductive load to ground, and from the ground into the active clamping circuit to thereby cause generation of the voltage across the first and second terminals of the power stage to maintain the power transistor in the power stage as being turned on into saturation;
   wherein the active clamping circuit is further configurable to, in the passive clamping hardware configuration, perform a fast decay of energy from the inductive load at load switchoff by shorting the first and second terminals of the power stage so as to maintain the power transistor in the power stage as being turned off into cutoff, establishing:
      a primary energy dissipation path from the inductive load to ground, from ground into the semi-active recirculation driver, and from the semi-active recirculation driver back to the inductive load; and
      a secondary energy dissipation path from the inductive load to ground, and from the ground into the active clamping circuit to thereby cause shorting of the first and second terminals of the power stage to maintain the power stage as being turned off.

2. The load driver of claim 1, wherein the semi-active recirculation driver comprises, when configured for active clamping hardware configuration:
   a Schottky diode having its cathode connected to the output of the power stage and its anode connected to a first node;

a resistor connected between the first node and ground;
a p-channel transistor having its drain connected to the first node and its source connected to ground;
an active shunting circuit powered between the battery and ground, and having an output connected to a gate of the p-channel transistor; and
a passive turn-on circuit powered between the output of the power stage and ground, the passive turn-on circuit having an output connected to the gate of the p-channel transistor;
wherein the passive turn-on circuit is configured to, in PWM mode, turn on the p-channel transistor to perform the slow-decay of energy from the inductive load during off-times in the PWM; and
wherein the active shunting circuit is configured to, in fast decay mode, turn off the p-channel transistor.

3. The load driver of claim 2, wherein the active shunting circuit comprises:
a PNP transistor having its emitter coupled to the battery, its collector coupled to a base of an NPN transistor through a first resistor, and its base connected to it emitter through a second resistor;
an n-channel transistor having its source coupled to ground, its drain coupled to the base of the PNP transistor through a third resistor, and its gate coupled to receive an RCD signal; and
a fourth resistor connected between the base and emitter of the NPN transistor, a collector of the NPN transistor being connected to the gate of the p-channel transistor of the semi-active recirculation driver.

4. The load driver of claim 2, wherein the passive turn-on circuit comprises:
a Zener diode having its cathode coupled to ground and its anode connected to the gate of the p-channel transistor of the semi-active recirculation driver;
a first resistor connected between the gate of the p-channel transistor of the semi-active recirculation driver and a first node;
a second resistor connected between the first node and ground;
a third resistor connected between the first node and the output of the power stage;
a first Schottky diode having its anode connected to the first node and its cathode connected to a second node;
a first capacitor connected between the second node and ground; and
a second Schottky diode having its anode connected to the second node and its cathode connected to the output of the power stage.

5. The load driver of claim 1, wherein the semi-active recirculation driver comprises, when configured for passive clamping hardware configuration:
a Schottky diode having its cathode connected to the output of the power stage and its anode connected to a first node;
a Zener diode having its anode connected to the first node and its cathode connected to ground;
a resistor connected between the first node and ground;
a p-channel transistor having its drain connected to the first node and its source connected to ground;
an active shunting circuit powered between the battery and ground, and having an output connected to a gate of the p-channel transistor; and
a passive turn-on circuit powered between the output of the power stage and ground, the passive turn-on circuit having an output connected to the gate of the p-channel transistor;
wherein the passive turn-on circuit is configured to, in PWM mode, turn on the p-channel transistor to perform the slow-decay of energy from the inductive load during off-times in the PWM; and
wherein the active shunting circuit is configured to, in the fast decay mode, turn off the p-channel transistor.

6. The load driver of claim 5, wherein the active shunting circuit comprises:
a PNP transistor having its emitter coupled to the battery, its collector coupled to a base of an NPN transistor through a first resistor, and its base connected to it emitter through a second resistor;
an n-channel transistor having its source coupled to ground, its drain coupled to the base of the PNP transistor through a third resistor, and its gate coupled to receive an RCD signal; and
a fourth resistor connected between the base and emitter of the NPN transistor, a collector of the NPN transistor being connected to the gate of the p-channel transistor of the semi-active recirculation driver.

7. The load driver of claim 5, wherein the passive turn-on circuit comprises:
a Zener diode having its cathode coupled to ground and its anode connected to the gate of the p-channel transistor of the semi-active recirculation driver;
a first resistor connected between the gate of the p-channel transistor of the semi-active recirculation driver and a first node;
a second resistor connected between the first node and ground;
a third resistor connected between the first node and the output of the power stage;
a first Schottky diode having its anode connected to the first node and its cathode connected to a second node;
a first capacitor connected between the second node and ground; and
a second Schottky diode having its anode connected to the second node and its cathode connected to the output of the power stage.

8. The load driver of claim 1, wherein the active clamping circuit comprises, when configured for active clamping hardware configuration:
a Zener diode having its cathode connected to the first driving pin of the gate driver and its anode connected to the second driving pin of the gate driver;
a first resistor connected between the second driving pin of the gate driver and a first node;
an active clamp biasing circuit connected between the first node and ground;
an active clamp compensation circuit having a first terminal connected to the first node and a second terminal connected to the second terminal of the power stage;
an active pull down circuit having a first terminal connected to the first node, and a second terminal connected to the second terminal of the power stage;
a second resistor connected between the first terminal of the power stage and a third terminal of the active pull down circuit;
a third resistor coupled between the first driving pin and the first terminal of the power stage;
wherein the active pull down circuit is configured to generate the voltage across the first and second terminals of the power stage sufficient to maintain the power transistor in the power stage as being turned on into the saturation region; and wherein the active clamp compensation circuit is configured to dissipate a portion of the energy from the inductive load.

9. The load driver of claim 8,
wherein the third resistor is connected between the first terminal of the gate driver and a second node; and
further comprising a fourth resistor connected between the first node and the first terminal of the power stage.

10. The load driver of claim 9, further comprising an active shunting circuit connected to selectively short the fourth resistor in response to a first control signal.

11. The load driver of claim 8, wherein the active clamp biasing circuit comprises:
a Schottky diode having its cathode connected to the first node of the active clamping circuit; and
a Zener diode having its cathode coupled to ground and its anode connected to an anode of the Schottky diode of the active clamp biasing circuit.

12. The load driver of claim 8, wherein the active clamp compensation circuit comprises a resistor coupled between the first terminal of the active clamp compensation circuit and the second terminal of the active clamp compensation circuit.

13. The load driver of claim 8, wherein the active clamp compensation circuit comprises a resistor connected between the second terminal of the power stage and an intermediate node, a Zener diode having its anode connected to the intermediate node and its cathode connected to the first node of the active clamping circuit, and a resistor connected in parallel with the Zener diode.

14. The load driver of claim 8, wherein the active pull down circuit comprises:
a first resistor connected between the first node of the active clamping circuit and a base of a NPN transistor; and
a second resistor connected between the base and emitter of the NPN transistor, wherein the emitter of the NPN transistor is connected to the second terminal of the power stage, wherein a collector of the NPN transistor is connected to the second resistor of the active clamping circuit.

15. The load driver of claim 1, wherein the active clamping circuit comprises, when configured for passive clamping hardware configuration:
a Zener diode having its cathode connected to the first driving pin of the gate driver and its anode connected to the second driving pin of the gate driver;
a first resistor connected between the second driving pin of the gate driver and a first node;
an active clamp biasing circuit connected between the first node and ground;
an active clamp compensation circuit having a first terminal connected to the first node and a second terminal connected to the second terminal of the power stage;
an active pull down circuit having a first terminal connected to the first node, a second terminal connected to the second terminal of the power stage, and a third terminal connected to the first terminal of the power stage;
a third resistor coupled between the first gate driver pin and the first terminal of the power stage;
wherein the active pull down circuit is configured to short the first and second terminals of the power stage to maintain the power stage as being turned off.

16. The load driver of claim 15,
wherein the third resistor is connected between the first terminal of the gate driver and a second node; and
further comprising a fourth resistor connected between the first node and the first terminal of the power stage.

17. The load driver of claim 16, further comprising an active shunting circuit connected to selectively short the fourth resistor in response to a first control signal.

18. The load driver of claim 15, wherein the active clamp biasing circuit comprises:
a Schottky diode having its cathode connected to the first node of the active clamping circuit; and
a Zener diode having its cathode coupled to ground and its anode connected to an anode of the Schottky diode of the active clamp biasing circuit.

19. The load driver of claim 15, wherein the active clamp compensation circuit comprises a resistor coupled between the first terminal of the active clamp compensation circuit and the second terminal of the active clamp compensation circuit.

20. The load driver of claim 19, wherein the active clamp compensation circuit comprises a resistor connected between the second terminal of the power stage and an intermediate node, a Zener diode having its anode connected to the intermediate node and its cathode connected to the first node of the active clamping circuit, and a resistor connected in parallel with the Zener diode.

21. The load driver of claim 15, wherein the active pull down circuit comprises:
a first resistor connected between the first node of the active clamping circuit and a base of a NPN transistor; and
a second resistor connected between the base and emitter of the NPN transistor, wherein the emitter of the NPN transistor is connected to the second terminal of the power stage, wherein a collector of the NPN transistor is connected to the second resistor of the active clamping circuit.

22. A method for operating a load driver for an inductive load, the method comprising:
configuring a gate driver to generate drive signals for driving a power stage that has an input connected to a battery and an output for driving the inductive load;
configuring a semi-active recirculation driver to:
in a pulse width modulation mode, activate circuitry to perform slow-decay of energy from the inductive load during off-times in the PWM cycle by creating a low impedance recirculation path;
in a fast decay mode of an active clamping hardware configuration, deactivate the circuitry that performs the slow-decay of energy from the inductive load during off-times in the PWM cycle and replace it with a high impedance recirculation path; and
in a fast decay mode of a passive clamping hardware configuration, deactivate the circuitry that performs the slow-decay of energy from the inductive load during off-times in the PWM cycle while diverting current to recirculate through a passive device with sufficient voltage drop; and
configuring an active clamping circuit to, in the active clamping hardware configuration, perform fast decay of energy from the inductive load at load switchoff by generating a voltage across first and second terminals of the power stage sufficient to maintain a power transistor in the power stage as being turned on into saturation, establishing:
a primary energy dissipation path from the inductive load to ground, and from ground to the battery, and from the battery to the power stage back to the inductive load; and a secondary energy dissipation path from the inductive load to ground, and from the ground into the active clamping circuit to thereby cause generation of the voltage across the first and second terminals of the power stage to maintain the power transistor in the power stage as being turned on into saturation;

in the passive clamping hardware configuration, perform fast decay of energy from the inductive load at load switchoff by shorting the first and second terminals of the power stage so as to maintain the power transistor in the power stage as being turned off into cutoff, establishing:

a primary energy dissipation path from the inductive load to ground, from ground into the semi-active recirculation driver, and from the semi-active recirculation driver back to the inductive load; and a secondary energy dissipation path from the inductive load to ground, and from the ground into the active clamping circuit to thereby cause shorting of the first and second terminals of the power stage to maintain the power stage as being turned off.

* * * * *